US012385137B2

(12) United States Patent
Ivanov et al.

(10) Patent No.: US 12,385,137 B2
(45) Date of Patent: Aug. 12, 2025

(54) METHOD FOR DEPOSITING VANADIUM-CONTAINING FILMS

(71) Applicant: Versum Materials US, LLC, Tempe, AZ (US)

(72) Inventors: Sergei V. Ivanov, Schnecksville, PA (US); Michael T. Savo, Bethlehem, PA (US)

(73) Assignee: Versum Materials US, LLC, Tempe, AZ (US)

( * ) Notice: Subject to any disclaimer, the term of this patent is extended or adjusted under 35 U.S.C. 154(b) by 78 days.

(21) Appl. No.: 18/554,126

(22) PCT Filed: Apr. 14, 2022

(86) PCT No.: PCT/US2022/071714
§ 371 (c)(1),
(2) Date: Oct. 5, 2023

(87) PCT Pub. No.: WO2022/226472
PCT Pub. Date: Oct. 27, 2022

(65) Prior Publication Data
US 2024/0191355 A1 Jun. 13, 2024

Related U.S. Application Data

(60) Provisional application No. 63/178,656, filed on Apr. 23, 2021.

(51) Int. Cl.
C23C 16/30 (2006.01)
C23C 16/44 (2006.01)
C23C 16/455 (2006.01)

(52) U.S. Cl.
CPC ...... *C23C 16/45553* (2013.01); *C23C 16/308* (2013.01); *C23C 16/4408* (2013.01); *C23C 16/4554* (2013.01)

(58) Field of Classification Search
CPC ..... C23C 16/34; C23C 16/303; C23C 16/308; C23C 16/4408; C23C 16/4554; C23C 16/45553
See application file for complete search history.

(56) References Cited

U.S. PATENT DOCUMENTS

| | | | |
|---|---|---|---|
| 4,228,038 A | 10/1980 | Konig | |
| 6,156,395 A * | 12/2000 | Zhang | C23C 16/405 427/126.3 |
| 2003/0022065 A1 | 1/2003 | Zhang et al. | |
| 2017/0309476 A1* | 10/2017 | Venkatasubramanian | H01L 21/0217 |
| 2018/0327913 A1* | 11/2018 | Lansalot-Matras | H01L 21/31122 |
| 2019/0177346 A1* | 6/2019 | Okabe | C07F 9/005 |
| 2020/0006080 A1 | 1/2020 | Osawa et al. | |
| 2020/0035486 A1 | 1/2020 | Venktasubramanian et al. | |
| 2020/0346928 A1 | 11/2020 | Habuka et al. | |
| 2021/0140043 A1 | 5/2021 | Thombare et al. | |
| 2021/0180184 A1* | 6/2021 | Alessio Verni | C23C 16/52 |
| 2022/0084831 A1* | 3/2022 | Shero | C23C 16/45527 |

FOREIGN PATENT DOCUMENTS

| | | | | |
|---|---|---|---|---|
| EP | 1735479 B1 | | 9/2012 | |
| JP | 61-48151 | * | 3/1986 | ............. G11B 11/10 |
| JP | 2004-323493 | * | 11/2004 | ............... C07F 9/00 |
| TW | 202020203 A | | 6/2020 | |

OTHER PUBLICATIONS

Rampelberg, Geert, et al. "Low temperature plasma-enhanced atomic layer deposition of thin vanadium nitride layers for copper diffusion barriers." Applied Physics Letters, 102, 111910 (2013), pp. 1-4.*
Kozen, Alexander C., et al., "Plasma-enhanced atomic layer deposition of vanadium nitride". J. Vac. Sci. Technol. A 37(6), Nov./Dec. 2019, 061505, pp. 1-8.*
Hirpara, Jignesh, et al., "Investigation of optical and anti-corrosive properties of reactively sputtered vanadium oxynitride thin films". Materials Today: Proceedings 44 (2021) 3065-3069.*
Rampelberg, Geert, et al. "Low Temperature Plasma-Enhanced ALD of Vanadium Nitride as Copper Diffusion Barrier." Atomic Layer Deposition, 13th International Conference, Abstracts, 2013. 1 page. Abstract Only.*
Ghimbeu, C. Matei, et al., "Crystalline vanadium nitride ultra-thin films obtained at room temperature by pulsed laser deposition". Surface & Coatings Technology 211 (2012) 158-162.*
Notice of Examination Opinion, Taiwan Application No. 11320804380, Aug. 9, 2024.
Kozen, Alexander C., et al., "Plasma-enhanced atomic layer deposition of vanadium nitride," Journal of Vacuum Science and Technology,A37(6), 061505, 2019.
Rampelberg, Geert, et al., "Low temperature plasma-enhanced atomic layer deposition of thin vanadium nitride layers for copper diffusion barriers," Applied Physics Letters, 102, 111910, 2013.
Elwin, Gareth S., et al., "Atmospheric-Pressure CVD of Vanadium Oxynitride on Glass: Potential Solar Control Coatings," Chemical Vapor Deposition, 6(2), 2000, pp. 59-63.

(Continued)

*Primary Examiner* — Bret P Chen
(74) *Attorney, Agent, or Firm* — William T. Slaven, IV; Versum Materials US, LLC

(57) ABSTRACT

A method for depositing vanadium-containing films, including vanadium nitride and vanadium oxynitride, that generally includes (i) contacting a substrate with vanadium oxytrichloride vapor in a deposition reactor, (ii) purging any unreacted vanadium oxytrichloride with inert gas, (iii) contacting the substrate with a nitrogen containing reactant in a deposition reactor and (iv) purging any unreacted nitrogen containing reactant with inert gas. Additional steps can be included, for example substrate (v) treatment with plasma to remove residual oxygen from oxynitride film.

15 Claims, 3 Drawing Sheets

(56) References Cited

OTHER PUBLICATIONS

Parkin, Ivan P., et al., "Atmospheric pressure chemical vapour deposition of vanadium nitride and oxynitride films on glass from reaction of VCl4 with NH3," Journal of Materials Chemistry, 11, 3120, 2001.
Newport, Anne, et al., "Formation of VN from VCl4 and NH(SiMe3)2 by APCVD—a Potential Solar Control Coating," Chemistry Europe, 21, 2004, pp. 4286-4290.
PCT International Search Report, International Application No. PCT/US2022/071714, ISA/KR, Aug. 5, 2022.

* cited by examiner

METHOD FOR DEPOSITING VANADIUM-CONTAINING FILMS

CROSS-REFERENCE TO RELATED APPLICATIONS

This application is a national stage application, filed under 35 U.S.C. § 371, of International Patent Application No. PCT/US2022/071714 (filed on 14 Apr. 2022) which claims the benefit of U.S. Provisional Patent Application No. 63/178,656 (filed on 23 Apr. 2021) each of which applications is incorporated herein by reference in their entirety.

BACKGROUND

Field

The disclosed and claimed subject matter relates to a method for depositing vanadium-containing films including vanadium nitride and vanadium oxynitride. The method generally includes (i) contacting a substrate with vanadium oxytrichloride vapor in a deposition reactor, (ii) purging any unreacted vanadium oxytrichloride with inert gas, (iii) contacting the substrate with a nitrogen containing reactant in the deposition reactor and (iv) purging any unreacted nitrogen containing reactant with inert gas. Additional steps can be included, for example treating the substrate with nitrogen plasma to remove residual oxygen from oxynitride film.

Background

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Metallic thin films and dielectric thin films are also used in microelectronics applications, such as the high-K dielectric oxide for dynamic random access memory (DRAM) applications and the ferroelectric perovskites used in infrared detectors and non-volatile ferroelectric random access memories (NV-FeRAMs).

Various precursors may be used to form metal-containing thin films and a variety of deposition techniques can be employed. Such techniques include reactive sputtering, ion-assisted deposition, sol-gel deposition, chemical vapor deposition (CVD) (also known as metalorganic CVD or MOCVD), and atomic layer deposition (ALD) (also known as atomic layer epitaxy). CVD and ALD processes are increasingly used as they have the advantages of enhanced compositional control, high film uniformity, and effective control of doping.

CVD is a chemical process whereby precursors are used to form a thin film on a substrate surface. In a typical CVD process, the precursors are passed over the surface of a substrate (e.g., a wafer) in a low pressure or ambient pressure reaction reactor. The precursors react and/or decompose on the substrate surface creating a thin film of deposited material. Volatile by-products are removed by gas flow through the reaction reactor. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction reactor. A second precursor is then passed over the substrate surface and reacts with the first precursor, forming a second monolayer of film over the first-formed monolayer of film on the substrate surface. This cycle is repeated to create a film of desired thickness.

However, the continual decrease in the size of microelectronic components, such as semiconductor devices, presents several technical challenges and has increased the need for improved thin film technologies. In particular, microelectronic components may include features on or in a substrate, which require filling, e.g., to form a conductive pathway or to form interconnections. Filling such features, especially in smaller and smaller microelectronic components, can be challenging because the features can become increasingly thin or narrow. Consequently, a complete filling of the feature, e.g., via ALD, would require infinitely long cycle times as the thickness of the feature approaches zero. Moreover, once the thickness of the feature becomes narrower than the size of a molecule of a precursor, the feature cannot be completely filled. As a result, a hollow seam can remain in a middle portion of the feature when ALD is performed. The presence of such hollow seams within a feature is undesirable because they can lead to failure of the device. Accordingly, there exists significant interest in the development of thin film deposition methods, particularly ALD methods that can selectively grow a film on one or more substrates and achieve improved filling of a feature on or in a substrate, including depositing a metal-containing film in a manner which substantially fills a feature without any voids.

CVD and ALD are specifically attractive for fabricating conformal metal containing films on substrates, such as silicon, silicon oxide, metal nitride, metal oxide and other metal-containing layers, using these metal-containing precursors. As noted above, in these techniques, a vapor of a volatile metal complex is introduced into a process reactor where it contacts the surface of a silicon wafer whereupon a chemical reaction occurs that deposits a thin film of pure metal or a metal compound. CVD occurs if the precursor reacts at the wafer surface either thermally or with a reagent added simultaneously into the process reactor and the film growth occurs in a steady state deposition. CVD can be applied in a continuous or pulsed mode to achieve the desired film thickness. In ALD, the precursor is chemisorbed onto the wafer as a self-saturating monolayer, excess unreacted precursor is purged away with an inert gas such as argon, then excess reagent is added which reacts with the monolayer of chemisorbed precursor to form metal or a metal compound. Excess reagent is then purged away with inert gas. This cycle can then be repeated multiple times to build up the metal or metal compound to a desired thickness with atomic precision since the chemisorption of precursor and reagent are self-limiting. ALD provides the deposition of ultra-thin yet continuous metal containing films with precise control of film thickness, excellent uniformity of film thickness and outstandingly conformal film growth to evenly coat deeply etched and highly convoluted structures such as interconnect vias and trenches. Thus, ALD is typically preferred for deposition of thin films on features with high aspect ratio.

Transition metal nitrides are used in semiconductor industry due to good barrier properties, high temperature stability, corrosion resistance and low resistivity. Vanadium nitride is specifically attractive due to almost metallic low resistivity with <100 µOhm cm. Vanadium nitride films are mainly deposited by reactive sputtering, high temperature nitridation of metal vanadium layer, chemical vapor deposition and atomic layer deposition.

Suitable metal precursors for ALD include those which are thermally stable to preclude any thermal decomposition occurring during the chemisorption stage yet are chemically reactive towards added reagent. Additionally, it is important that the metal precursors are monomeric for maximum volatility and clean evaporation leaving only a trace of involatile residue. It is also desirable that the precursors are liquid at room temperature.

In this regard, the *Journal of Vacuum Science and Technology*, A37, 061505, (2019) describes plasma-enhanced atomic layer deposition process for vanadium nitride (VN) using tetrakis(dimethylamido)vanadium and nitrogen plasma over a deposition temperature range from 150° C. to 300° C. The authors characterize these films using x-ray photoelectron spectroscopy, x-ray diffraction, spectroscopic ellipsometery. The authors demonstrate a stable VN growth window between 250° C. and 350° C., with deposition temperatures below this leading to incomplete reaction between the precursors.

ALD deposition of vanadium nitride using tetrakis(ethylmethylamino)vanadium and $NH_3$ plasma at deposition temperatures between 70° C. and 150° C. on silicon substrates and polymer foil has also been described. See *Appl. Phys. Lett.*, 102, 111910 (2013). X-ray photoelectron spectroscopy revealed a composition close to stoichiometric VN, while x-ray diffraction showed the δ-VN crystal structure. The resistivity was as low as 200 µΩcm for the as deposited films and further reduced to 143 µΩcm and 93 µΩcm by annealing in $N_2$ and $H_2/He/N_2$, respectively. Tetrakis(dimethylamido)vanadium and tetrakis(ethylmethylamino)vanadium, however, are organometallic precursors with low thermal stability. Thermal decomposition results in parasitic CVD and poor film conformality in high aspect ratio features. Thus, more thermally stable precursors are desired for deposition of conformal vanadium nitride films.

Other ALD depositions have been described. For example, *Chemical Vapor Deposition*, 6(2), 59-63 (2000) describe atmospheric plasma chemical vapor deposition of vanadium oxynitride using reaction of vanadium oxychloride and ammonia. The atmospheric pressure chemical vapor deposition of vanadium nitride and oxynitride coatings by the reaction of $VCl_4$ and $NH_3$ at 350-650° C. in *J. Material Chemistry*, 11, 3120 (2001). In addition, *Chemistry Europe*, 21, 4286-4290 (2000) describe synthesis of vanadium nitride and vanadium oxynitride films by atmospheric pressure CVD at 300-500 C of vanadium(IV) chloride and vanadium oxytrichloride with hexamethyldisilazane (HMDS). When the films were deposited by reaction of $VOCl_3$; with HMDS, the films consisted of mixed phases of vanadium oxynitride and $V_2O_3$.

Notwithstanding the above, atmospheric pressure chemical vapor deposition cannot be used for deposition of thin and conformal vanadium nitride films. Thus, there is a need for an ALD process for depositing thin conformal vanadium nitride films with low resistivity described herein.

SUMMARY

In one embodiment, the disclosed and claimed subject matter relates to a method for depositing a vanadium-containing film including vanadium nitride and vanadium oxynitride. The method generally includes (i) contacting a substrate with vanadium oxytrichloride vapor in a deposition reactor, (ii) purging any unreacted vanadium oxytrichloride with inert gas, (iii) contacting the substrate with a nitrogen containing reactant (e.g., ammonia gas) in the deposition reactor and (iv) optionally purging any unreacted nitrogen containing reactant with inert gas. In a further aspect of this embodiment, the method includes (v) treating the substrate with plasma (e.g., nitrogen plasma) to remove residual oxygen from the vanadium-containing film. In a further aspect, the method consists essentially of steps (i), (ii), (iii) and (iv). In a further aspect, the method consists essentially of steps (i), (ii), (iii), (iv) and (v). In a further aspect, the method consists of steps (i), (ii), (iii) and (iv). In a further aspect, the method consists of steps (i), (ii), (iii), (iv) and (v).

Unlike related art the processes, the disclosed and claimed process is conducted under ALD conditions to provide highly conformal films of vanadium nitride. The process is also conducted under low pressure, preferably <about 50 torr, more preferably <about 20 torr, and more preferably <about 10 torr.

This summary section does not specify every embodiment and/or incrementally novel aspect of the disclosed and claimed subject matter. Instead, this summary only provides a preliminary discussion of different embodiments and corresponding points of novelty over conventional techniques and the known art. For additional details and/or possible perspectives of the disclosed and claimed subject matter and embodiments, the reader is directed to the Detailed Description section and corresponding figures of the disclosure as further discussed below.

The order of discussion of the different steps described herein has been presented for clarity sake. In general, the steps disclosed herein can be performed in any suitable order. Additionally, although each of the different features, techniques, configurations, etc. disclosed herein may be discussed in different places of this disclosure, it is intended that each of the concepts can be executed independently of each other or in combination with each other as appropriate. Accordingly, the disclosed and claimed subject matter can be embodied and viewed in many different ways.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings.

DEFINITIONS

Figure 1:
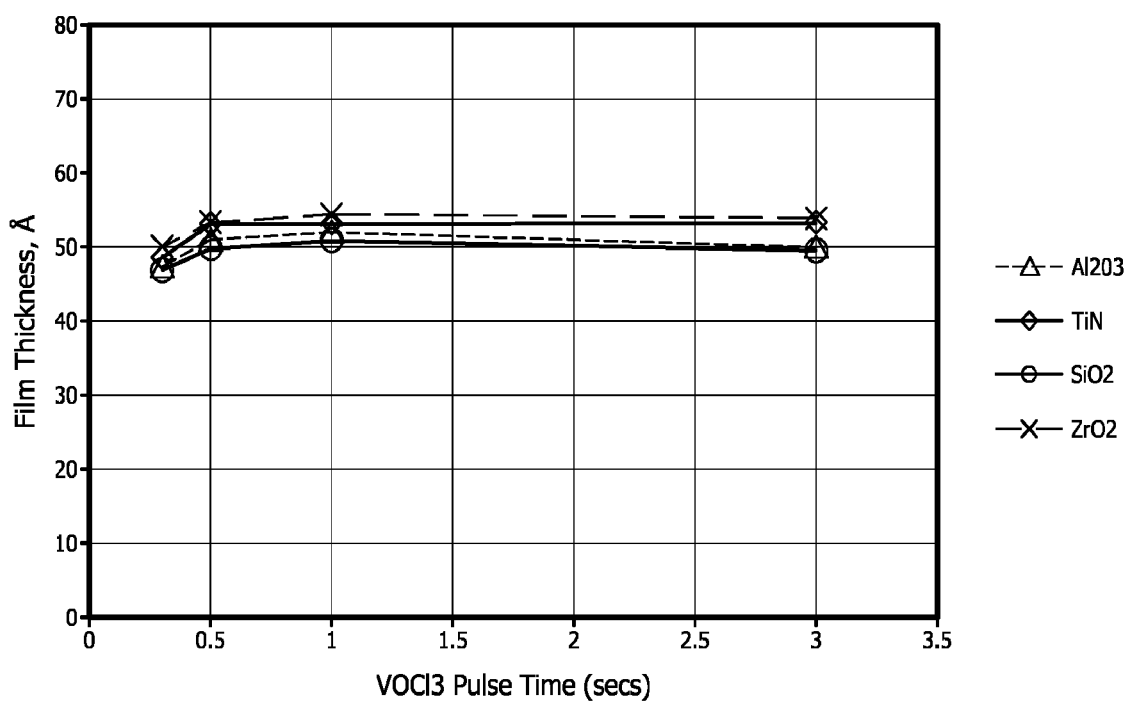
FIG. 1 illustrates the dependence of film thickness deposited by $VOCl_3$ and ammonia ALD process on $VOCl_3$ pulse time.

Unless otherwise stated, the following terms used in the specification and claims shall have the following meanings for this application.

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B," "A or B," "A" and "B."

The terms "substituent," "radical," "group" and "moiety" may be used interchangeably.

As used herein, the terms "metal-containing complex" (or more simply, "complex") and "precursor" are used interchangeably and refer to metal-containing molecule or compound which can be used to prepare a metal-containing film by a vapor deposition process such as, for example, ALD or CVD. The metal-containing complex may be deposited on, adsorbed to, decomposed on, delivered to, and/or passed over a substrate or surface thereof, as to form a metal-containing film. In one or more embodiments, the metal-containing complexes disclosed herein are metal halide complexes, particularly molybdenum chloride complexes.

As used herein, the term "metal-containing film" includes not only an elemental metal film as more fully defined below, but also a film which includes a metal along with one or more elements, for example a metal oxide film, metal nitride film, metal silicide film, a metal carbide film and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp. 1-36.

As used herein, the term "feature" refers to an opening in a substrate which may be defined by one or more sidewalls, a bottom surface, and upper corners. In various aspects, the feature may be a via, a trench, contact, dual damascene, etc.

As used herein, the terms "selective growth," "selectively grown" and "selectively grows" may be used synonymously and refer to film growth on at least a portion of a first substrate and substantially no film growth on a remaining portion of the first substrate as well as more film growth on at least a portion of the first substrate compared to film growth on a remaining portion of the first substrate. For example, selective growth may include growth of a film on a lower portion of a feature while less film growth or no film growth may occur in an upper portion of that feature or outside that feature. With respect to more than one substrate, the terms "selective growth" "selectively grown" and "selectively grows" also encompass film growth on a first substrate and substantially no film growth on a second substrate (or a third substrate, or fourth substrate or a fifth substrate, etc.) as well as more film growth on the first substrate than on the second substrate (or a third substrate, or fourth substrate or a fifth substrate, etc.).

The term "about" or "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

"Halo" or "halide" refers to a halogen (e.g., F. Cl, Br and I).

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that any of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

In the below-described embodiments, it is understood that the steps of the methods may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting dielectric film.

In one embodiment, the disclosed and claimed subject matter relates to a method for depositing a vanadium-containing film including vanadium nitride and vanadium oxynitride. The method generally includes (i) contacting a substrate with vanadium oxytrichloride vapor in a deposition reactor, (ii) purging any unreacted vanadium oxytrichloride with inert gas, (iii) contacting the substrate with a nitrogen containing reactant (e.g., ammonia gas) in a deposition reactor and (iv) optionally purging of any unreacted nitrogen containing reactant with inert gas. In a further aspect of this embodiment, the method consists essentially of steps (i), (ii), (iii) and (iv). In a further aspect of this embodiment, the method consists of steps (i), (ii), (iii) and (iv).

In one embodiment, the disclosed and claimed subject matter relates to a method for depositing a vanadium-containing film including vanadium nitride and vanadium oxynitride. The method generally includes (i) contacting a substrate with vanadium oxytrichloride vapor in a deposition reactor, (ii) purging any unreacted vanadium oxytrichloride with inert gas, (iii) contacting the substrate with a nitrogen containing reactant (e.g., ammonia gas) in a deposition reactor, (iv) optionally purging of any unreacted nitrogen containing reactant with inert gas, and (v) treating the substrate with plasma (e.g., nitrogen plasma, hydrogen plasma) to remove residual oxygen from the vanadium-containing film. In a further aspect of this embodiment, the method consists essentially of steps (i), (ii), (iii), (iv) and (v). In a further aspect of this embodiment, the method consists of steps (i), (ii), (iii), (iv) and (v).

Delivery of Vanadium Oxytrichloride

As noted above, step (i) of the disclosed and claimed method includes contacting a substrate with vanadium oxytrichloride vapor. Vanadium oxytrichloride is highly suitable for use as volatile precursor for ALD and plasma enhanced atomic layer deposition (PEALD). As used herein, the term "atomic layer deposition process" refers to a self-limiting (e.g., the amount of film material deposited in each reaction cycle is constant), sequential surface chemistry that deposits films of materials onto substrates of varying compositions.

In another embodiment, the vanadium oxytrichloride vapor pulse time is from about 0.1 seconds to about 3 seconds. In another embodiment, the vanadium oxytrichloride vapor pulse time is from about 0.3 seconds to about 3 seconds. In another embodiment, the vanadium oxytrichloride vapor pulse time is about 0.1 second. In another embodiment, the vanadium oxytrichloride vapor pulse time is about 0.25 second. In another embodiment, the vanadium oxytrichloride vapor pulse time is about 0.5 second. In another embodiment, the vanadium oxytrichloride vapor pulse time is about 1 second. In another embodiment, the vanadium oxytrichloride vapor pulse time is about 1.5 seconds. In another embodiment, the vanadium oxytrichloride vapor pulse time is about 2 seconds.

In one embodiment, the vanadium oxytrichloride vapor is separated from other precursor materials prior to and/or during the introduction to the reactor. This process avoids pre-reaction of the metal precursor with any other materials.

In another embodiment, the vanadium oxytrichloride vapor is alternatively exposed to the substrate with other reactants (e.g., ammonia vapor, and/or other precursors or reagents). This process enables film growth to proceed by self-limiting control of the surface reactions, the pulse length of each precursor or reagent and the deposition temperature. It should be noted, however, that film growth ceases once the surface of the substrate is saturated with vanadium oxytrichloride vapor.

In another embodiment, a flow of argon and/or other gas is employed as a carrier gas to help deliver the vapor of the vanadium oxytrichloride to the reaction reactor during the precursor pulsing.

Vanadium Oxytrichloride Purging Step

As noted above, step (ii) of the disclosed and claimed method includes purging any unreacted vanadium oxytrichloride with inert gas. Purging with an inert gas removes unabsorbed excess complex from the process reactor.

In one embodiment, for example, the purge time varies from about 1 seconds to about 90 seconds. In one embodiment, for example, the purge time varies from about 15 seconds to about 90 seconds. In one embodiment, for example, the purge time varies from about 15 seconds to about 60 seconds. In another embodiment, the purge time is about 30 seconds. In another embodiment, the purge time is about 60 seconds. In another embodiment, the purge time is about 90 seconds.

In one embodiment, the purge gas includes argon. In another embodiment, the purge gas includes nitrogen.

Nitrogen Containing Reactant Treatment

As noted above, step (iii) of the disclosed and claimed method includes contacting the substrate with a nitrogen containing reactant in the deposition reactor for a period of time. In one embodiment, the nitrogen containing reactant includes one or more of ammonia, hydrazine, monoalkylhydriazine and dialkylhydrazine. In another embodiment, the nitrogen containing reactant includes ammonia gas.

In one embodiment, for example, the nitrogen containing reactant pulse time varies from about 0.5 seconds to about 5 seconds. In one embodiment, for example, the nitrogen containing reactant pulse time is about 2.5 seconds. In one embodiment, for example, the nitrogen containing reactant pulse time is about 5 seconds.

Optional Nitrogen Containing Reactant Purging Step

As noted above, step (iv) of the disclosed and claimed method includes optionally purging of any unreacted nitrogen containing reactant with inert gas. Purging with an inert gas removes any remaining nitrogen containing reactant from the process reactor. In one embodiment, the purge gas includes argon. In another embodiment, the purge gas includes nitrogen. As those skilled in the art will recognize, in many instances, if not in most instances, the disclosed and claimed process will include the step of purging the unreacted nitrogen containing reactant. On exception where nitrogen containing reactant purging would not occur is, for example, where the unreacted nitrogen containing reactant gas functions as a nitrogen source for a subsequent plasma treatment (described below).

In one embodiment, for example, the optional nitrogen containing reactant purge time varies from about 15 seconds to about 90 seconds. In one embodiment, for example, the optional nitrogen containing reactant purge time varies from about 15 seconds to about 60 seconds. In another embodiment, the optional nitrogen containing reactant purge time is about 30 seconds. In another embodiment, the optional nitrogen containing reactant purge time is about 60 seconds. In another embodiment, the optional nitrogen containing reactant purge time is about 90 seconds.

Plasma Treatment

As noted above, step (v) of the disclosed and claimed method includes treating the substrate with nitrogen plasma or hydrogen plasma to remove residual oxygen from the vanadium-containing film formed during the previous steps.

In one embodiment, the use of plasma constitutes a direct plasma-generated process in which plasma is directly generated in the reactor. In another embodiment, the use of plasma constitutes a remote plasma-generated process in which plasma is generated outside of the reactor and supplied into the reactor.

When nitrogen plasma is utilized, the nitrogen source can include nitrogen (N2), ammonia, hydrazine, monoalkylhydriazine, dialkylhydrazine. In this regard, and as noted above, when the nitrogen plasma relies on ammonia as the nitrogen source, the optional nitrogen containing reactant purge step (iv) can be omitted.

Operating Conditions

As noted above, the disclosed and claimed vanadium deposition process can be effectively conducted under very favorable ALD conditions to provide highly conformal films of vanadium nitride.

In one embodiment the substrate (e.g., a silicon oxide, aluminum oxide ($Al_2O_3$), titanium nitride (TiN), silicon oxide ($SiO_2$) and zirconium oxide ($ZrO_2$ is heated on a heater stage in a reaction reactor that is exposed to vanadium oxytrichloride precursor initially to allow the complex to chemically adsorb onto the surface of the substrate. In one embodiment, the substrate temperature is from about 300° C. to about 600° C. In a further aspect of this embodiment, the substrate temperature is from about 350° C. to about 550° C. In a further aspect of this embodiment, the substrate temperature is from about 400° C. to about 500° C.

In another embodiment, the reactor pressure for depositions according to the disclosed and claimed process is ≤ about 50 torr. In another embodiment, the reactor pressure for depositions according to the disclosed and claimed process is ≤ about 40 torr. In another embodiment, the reactor pressure for depositions according to the disclosed and claimed process is ≤ about 30 torr. In a further aspect of this embodiment, the reactor pressure is ≤ about 20 torr. In a further aspect of this embodiment, the reactor pressure is ≤ about 10 torr. In a further aspect of this embodiment, the reactor pressure is ≤ about 5 torr.

Cycles and Order of Steps

In the above-described embodiments, as well as the other embodiments described herein, the described steps (e.g., (i) through (iv) or (i) through (v)) define one cycle of the method. It is to be understood that a cycle can be repeated until the desired thickness of a film is obtained.

In the embodiments described herein, it is understood that the steps of the methods may be performed in a variety of orders, may be performed sequentially or concurrently (e.g., during at least a portion of another step), and any combination thereof. In addition, the respective step of supplying vanadium oxytrichloride and nitrogen source may be performed by varying the duration of the time for supplying them to change film composition.

Exemplary Processes

In one exemplary embodiment of the disclosed and claimed subject matter, a vanadium-containing film including vanadium nitride and vanadium oxynitride is formed using a ALD deposition method that includes the steps of:
  a. providing a substrate in a reactor;
  b. introducing into the reactor a vapor comprising vanadium oxytrichloride;
  c. chemisorbing vanadium oxytrichloride onto the substrate;
  d. purging away the unreacted vanadium oxytrichloride using a purge gas;
  e. introducing a nitrogen source into the reactor; and
  f. optionally purging away any nitrogen source.

In this exemplary embodiment, the nitrogen source includes one or more of nitrogen ($N_2$), ammonia, hydrazine, monoalkylhydriazine and dialkylhydrazine.

In another exemplary embodiment of the disclosed and claimed subject matter, a vanadium nitride film is formed using a ALD deposition method that includes the steps of:
  a. providing a substrate in a reactor;
  b. introducing into the reactor a vapor comprising vanadium oxytrichloride;
  c. chemisorbing vanadium oxytrichloride onto the substrate;
  d. purging away the unreacted vanadium oxytrichloride using a purge gas;
  e. introducing ammonia vapor into the reactor
  f. optionally purging away any ammonia from reactor
  g. introducing nitrogen, hydrogen or ammonia vapor into reactor
  h. applying direct or remote plasma into the reactor to remove residual impurities from the film; and
  i. purging away nitrogen, hydrogen or ammonia from the reactor.

Films

The disclosed and claimed subject matter further includes films prepared by the methods described herein.

In one embodiment, the films formed by the methods described herein have trenches, vias or other topographical features with an aspect ratio of about 1 to about 60. In a further aspect of this embodiment, the aspect ratio is about 1 to about 50. In a further aspect of this embodiment, the aspect ratio is about 1 to about 40. In a further aspect of this embodiment, the aspect ratio is about 1 to about 30. In a further aspect of this embodiment, the aspect ratio is about 1 to about 20. In a further aspect of this embodiment, the aspect ratio is about 1 to about 10. In a further aspect of this embodiment, the aspect ratio is greater than about 1. In a further aspect of this embodiment, the aspect ratio is greater than about 2. In a further aspect of this embodiment, the aspect ratio is greater than about 5. In a further aspect of this embodiment, the aspect ratio is greater than about 10. In a further aspect of this embodiment, the aspect ratio is greater than about 15. In a further aspect of this embodiment, the aspect ratio is greater than about 20. In a further aspect of this embodiment, the aspect ratio is greater than about 30. In a further aspect of this embodiment, the aspect ratio is greater than about 40. In a further aspect of this embodiment, the aspect ratio is greater than about 50.

In another embodiment, the films formed by the methods described herein have a resistivity of between about 150 to about 500. In a further aspect of this embodiment, the films have a resistivity of about 175 to about 450. In a further aspect of this embodiment, the films have a resistivity of about 175 to about 400. In a further aspect of this embodiment, the films have a resistivity of about 175 to about 350. In a further aspect of this embodiment, the films have a resistivity of about 175 to about 300. In a further aspect of this embodiment, the films have a resistivity of about 175 to about 250. In a further aspect of this embodiment, the films have a resistivity of about 150. In a further aspect of this embodiment, the films have a resistivity of about 175. In a further aspect of this embodiment, the films have a resistivity of about 200. In a further aspect of this embodiment, the films have a resistivity of about 250. In a further aspect of this embodiment, the films have a resistivity of about 300. In a further aspect of this embodiment, the films have a resistivity of about 350. In a further aspect of this embodiment, the films have a resistivity of about 400. In a further aspect of this embodiment, the films have a resistivity of about 450. In a further aspect of this embodiment, the films have a resistivity of about 500.

EXAMPLES

Reference will now be made to more specific embodiments of the present disclosure and experimental results that provide support for such embodiments. The examples given below more fully illustrate the disclosed and claimed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Example 1

Conditions: Deposition temperature was 360 ° C.; reactor pressure was 2 torr.

Experimental: In this experiment the $VOCl_3$ pulse time varied from 0.3 to 3 sec; argon purge was 30 seconds, ammonia pulse was 5 seconds, and argon purge after ammonia pulse was 30 seconds. The experiment demonstrates self-limiting, saturating behavior of $VOCl_3$ precursor on various substrates, such as aluminum oxide ($Al_2O_3$), titanium nitride (TiN), silicon oxide ($SiO_2$) and zirconium oxide ($ZrO_2$). This behavior is indicative of an ALD process.

FIG. 1 illustrates the dependence of film thickness deposited by $VOCl_3$ and ammonia ALD process on $VOCl_3$ pulse time for this example.

Example 2

Conditions: Deposition temperature was 360 ° C.; reactor pressure was 2 torr.

Experimental: In this experiment, $VOCl_3$ pulse time was 1 second; argon purge was 30 seconds, ammonia pulse varied from 0.5 to 5 seconds, and argon purge after ammonia pulse was 30 seconds. The experiment demonstrates self-limiting, saturating behavior of ammonia reagent on various substrates, such as aluminum oxide ($Al_2O_3$), titanium nitride (TiN), silicon oxide ($SiO_2$) and zirconium oxide ($ZrO_2$). This behavior is indicative of ALD process.

Figure 2:
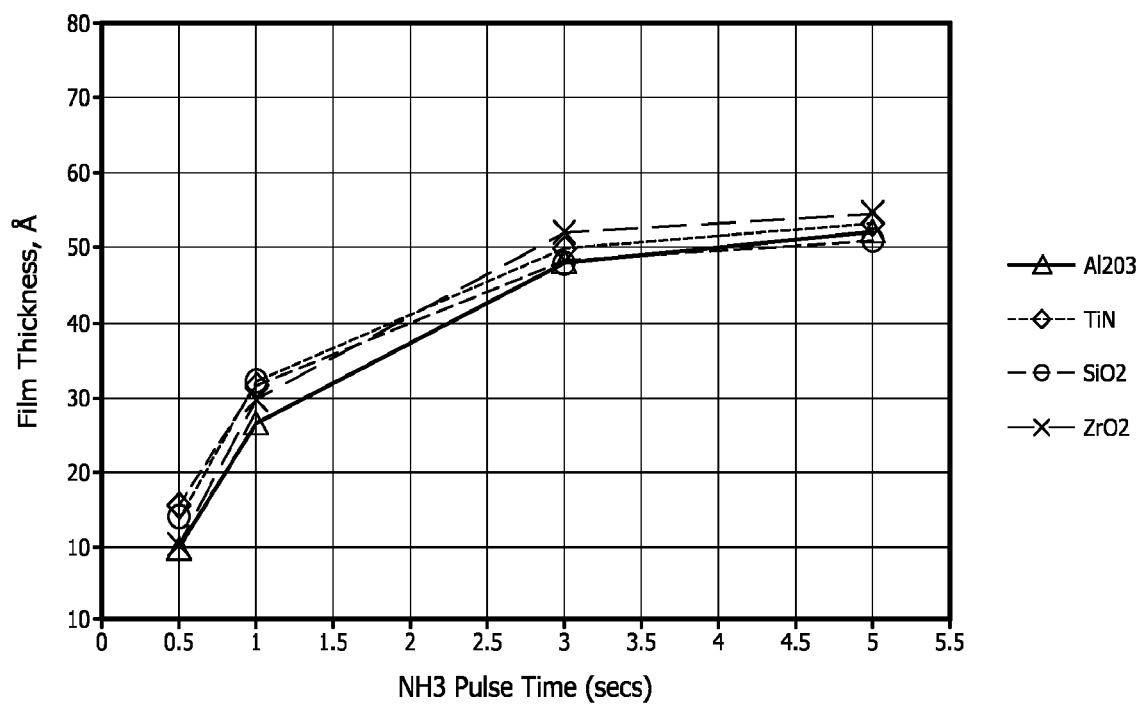
FIG. 2 illustrates the dependence of film thickness deposited by $VOCl_3$ and ammonia ALD process on ammonia pulse time.

FIG. 2 illustrates the dependence of film thickness deposited by $VOCl_3$ and ammonia ALD process on ammonia pulse time for this example.

Example 3

Conditions: Substrate temperature was 463 ° C.; reactor pressure was 2 torr.

Experimental: In this experiment, $VOCl_3$ pulse was 1 second, argon purge was 60 seconds, ammonia pulse was 5 sec, and argon purge after ammonia was 90 sec. Approximately 100% conformality was achieved on high aspect ratio wafer indicative of ALD process.

Figure 3:
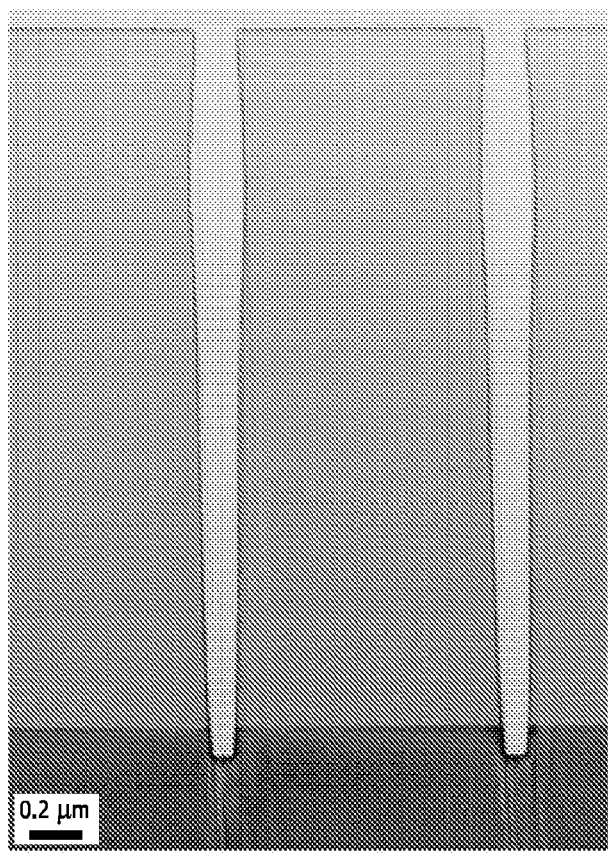
FIG. 3 illustrates TEM cross-section of trench patterned substrate according to an aspect of the disclosed and claimed subject matter.

FIG. 3 illustrates the TEM cross-section of trench patterned substrate with approximately 1/20 aspect ratio with a thin VN film deposited by $VOCl_3$ and $NH_3$ ALD process for this example.

Results

Table 1 shows the composition of vanadium oxynitride and vanadium nitride films deposited by $VOCl_3$ and $NH_3$ process at different substrate temperatures as measured by Rutherford Backscattering Spectrometry (RBS). At 500 ° C. wafer temperature close to stoichiometric vanadium nitride film was deposited with no detectable chloride in the film. When $N_2$ plasma step was introduced after $VOCl_3/Ar/NH_3/Ar$ sequence, further reduction in oxygen content and stoichiometric VN film was deposited: 46 atomic (at) % of vanadium and 46 atomic % of oxygen.

TABLE 1

| Wafer Temp. (° C.) | $N_2$ Plasma | V, at % by RBS | N, at % by RBS | O, at % by RBS | Cl, at % by RBS |
|---|---|---|---|---|---|
| 360 | No | 39.2 | 22.9 | 37.5 | 0.4 |
| 463 | No | 41.0 | 35.8 | 22.9 | 0.3 |
| 500 | No | 47.0 | 43.0 | 10.0 | ND |
| 500 | Yes | 46.0 | 46.0 | 8.0 | ND |

Table 2 shows film resistivity of vanadium nitride on thermal silicon oxide substrate of different deposition process sequences of the disclosed subject matter. Wafer temperature was 463° C. Ammonia flow rate was 300 sccm. Carrier gas flow via $VOCl_3$ bubbler was 50 sccm This data demonstrates that introduction of $N_2$ plasma cycle results in significant reduction of film resistivity compared to film treatment with thermal hydrogen (no effect) and hydrogen plasma (higher resistivity).

TABLE 2

| Run | Process Sequence | Cycle No. | Film Thickness, Å | Sheet Resistance, Ohm/sq | Film Resistivity, μOhm cm |
|---|---|---|---|---|---|
| 1 | $VOCl_3/Ar/NH_3/Ar$ | 100 | 61.3 | 441.3 | 270.40 |
| 2 | $VOCl_3/Ar/NH_3/Ar/H_2/Ar$ | 200 | 129.6 | 211.2 | 273.6 |
| 3 | $VOCl_3/Ar/NH_3/Ar/H_2$ Plasma/Ar | 200 | 245.2 | 183.2 | 449.22 |
| 4 | $VOCl_3/Ar/NH_3/Ar/N_2$ Plasma/Ar | 200 | 116.8 | 164.1 | 191.6 |

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. A method for depositing a vanadium nitride or vanadium oxynitride film comprising the steps of:
   (i) contacting a substrate with vanadium oxytrichloride vapor in a deposition reactor;
   (ii) purging unreacted vanadium oxytrichloride with a first inert gas;
   (iii) contacting the substrate with a nitrogen containing reactant in the deposition reactor;
   (iv) optionally purging unreacted nitrogen containing reactant with a second inert gas; and
   (v) optionally treating the substrate with plasma;
   wherein the deposited vanadium nitride or vanadium oxynitride film has less than 10 at % of oxygen and less than 0.3 at % of chloride.

2. The method of claim 1, wherein the step of (i) contacting the substrate with vanadium oxytrichloride vapor comprises pulsing the vanadium oxytrichloride vapor for about 0.1 seconds to about 3 seconds.

3. The method of claim 1, wherein the step of (ii) purging unreacted vanadium oxytrichloride with the first inert gas comprises a purge time of about 1 seconds to about 90 seconds.

4. The method of claim 1, wherein the step (iii) nitrogen containing reactant comprises one or more of ammonia, hydrazine, monoalkylhydriazine and dialkylhydrazine.

5. The method of claim 1, wherein the step (iii) nitrogen containing reactant comprises ammonia.

6. The method of claim 1, wherein the step of (iii) contacting the substrate with ammonia gas comprises pulsing the nitrogen containing reactant for about 0.5 seconds to about 5 seconds.

7. The method of claim 1, wherein the step of (iv) optionally purging of any unreacted nitrogen containing reactant with the second inert gas comprises a purge time of about 15 seconds to about 90 seconds.

8. The method of claim 1, wherein the step of (v) treating the substrate with plasma to remove residual oxygen from oxynitride film comprises treatment with nitrogen ($N_2$) plasma or hydrogen ($H_2$) plasma.

9. The method of claim 1, wherein the substrate comprises silicon oxide.

10. The method of claim 1, wherein the substrate comprises aluminum oxide.

11. The method of claim 1, wherein the substrate comprises titanium nitride.

12. The method of claim 1, wherein the substrate comprises titanium oxide.

13. The method of claim 1, wherein the substrate comprises zirconium oxide.

14. The method of claim 1, wherein the substrate is heated to a temperature from about 500° C. to about 600° C.

15. The method of claim 1, wherein the deposition reactor is at a pressure≤about 50 torr.

* * * * *